(12) United States Patent
Lang et al.

(10) Patent No.: US 9,419,244 B2
(45) Date of Patent: Aug. 16, 2016

(54) ORGANIC LIGHT-EMITTING ELEMENT AND METHOD OF PRODUCING AN ORGANIC LIGHT-EMITTING ELEMENT

(71) Applicant: OSRAM OLED GmbH, Regensburg (DE)

(72) Inventors: Erwin Lang, Regensburg (DE); Marc Philippens, Regensburg (DE); Tilman Schlenker, Nittendorf (DE); Richard Baisl, Regensburg (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 14/398,821

(22) PCT Filed: May 14, 2013

(86) PCT No.: PCT/EP2013/059938
§ 371 (c)(1),
(2) Date: Nov. 4, 2014

(87) PCT Pub. No.: WO2013/171209
PCT Pub. Date: Nov. 21, 2013

(65) Prior Publication Data
US 2015/0129846 A1 May 14, 2015

(30) Foreign Application Priority Data
May 15, 2012 (DE) .......... 10 2012 208 142

(51) Int. Cl.
*H01L 21/66* (2006.01)
*H01L 51/52* (2006.01)
*H01L 51/56* (2006.01)

(52) U.S. Cl.
CPC ........ *H01L 51/5253* (2013.01); *H01L 51/5203* (2013.01); *H01L 51/56* (2013.01); *H01L 51/5275* (2013.01)

(58) Field of Classification Search
CPC .. H01L 51/5253; H01L 51/5203; H01L 51/56
USPC .......................................................... 438/26
See application file for complete search history.

(56) References Cited

U.S. PATENT DOCUMENTS 6,692,610 B2  2/2004 Low et al.
2008/0272367 A1  11/2008 Cok
(Continued)

FOREIGN PATENT DOCUMENTS

CN            101859792        10/2010
DE   10 2009 024 411 A1        9/2010
(Continued)

OTHER PUBLICATIONS

N. Pinna at al., "Atomic Layer Deposition of Nanostructured Materials", Table 6.1 and Chapter 6.2, *Challenge of LT-ALD*. 2012, ISBN:978-3-527-32797-3.
(Continued)

*Primary Examiner* — David S Blum
(74) *Attorney, Agent, or Firm* — DLA Piper LLP (US)

(57) ABSTRACT

An organic light-emitting component includes a substrate on which a functional layer stack is applied, the stack including a first electrode, an organic functional layer stack thereover including an organic light-emitting layer and a translucent second electrode thereover, and a translucent halogen-containing thin-film encapsulation arrangement over the translucent second electrode, wherein a translucent protective layer having a refractive index of more than 1.6 is arranged directly on the translucent second electrode between the translucent second electrode and the thin-film encapsulation arrangement.

15 Claims, 1 Drawing Sheet

(56) References Cited

U.S. PATENT DOCUMENTS

| | | |
|---|---|---|
| 2008/0286448 A1 | 11/2008 | Elam et al. |
| 2011/0049730 A1 | 3/2011 | Schmid et al. |
| 2011/0114992 A1 | 5/2011 | Schmid et al. |
| 2011/0121354 A1 | 5/2011 | Schmid et al. |
| 2012/0098022 A1 | 4/2012 | Jan et al. |

FOREIGN PATENT DOCUMENTS

| | | |
|---|---|---|
| DE | 10 2010 002422 A1 | 11/2010 |
| DE | 11 2009 002 034 T5 | 6/2011 |
| DE | 10 2011 084 276 A1 | 4/2013 |
| JP | 02-072594 | 3/1990 |
| JP | 2004-022281 | 1/2004 |
| JP | 2006-165537 | 6/2006 |
| JP | 2007-265841 | 10/2007 |
| JP | 2009-152612 | 7/2009 |
| JP | 2011-054526 | 3/2011 |
| WO | 2009/094997 A1 | 8/2009 |
| WO | 2009/095006 A1 | 8/2009 |
| WO | 2009/126115 A1 | 10/2009 |
| WO | 2010/066245 A1 | 6/2010 |
| WO | 2010/108894 A1 | 9/2010 |
| WO | 2012/007575 A1 | 1/2012 |

OTHER PUBLICATIONS

English translation of the Notification of Reasons for Refusal dated Nov. 24, 2015 of corresponding Japanese Application No. 2015-512031.

English translation of a Notification of the First Office Action along with a Search Report dated Mar. 2, 2016 from corresponding Chinese Application No. 201380025741.9.

ORGANIC LIGHT-EMITTING ELEMENT AND METHOD OF PRODUCING AN ORGANIC LIGHT-EMITTING ELEMENT

TECHNICAL FIELD

This disclosure relates to an organic light-emitting component and a method of producing an organic light-emitting component.

BACKGROUND

Organic light-emitting diodes (OLEDs) are known for lighting purposes and display applications, and typically comprise an anode on a substrate, and a cathode thereover with, arranged between them, organic layers comprising at least one light-emitting layer.

In OLEDs, distinction is made between those which emit light in one direction and those which emit light in two directions. One-side emitting OLEDs may be formed as so-called "bottom emitters" in which the light is emitted through the substrate lying opposite the encapsulation, or as so-called "top emitters," in which the light is emitted through the encapsulation. Two-side emitting OLEDs are formed simultaneously as a bottom emitter and top emitter. If all the layers of a two-side emitting OLED are configured to be transparent, then the two-side emitting OLED is also referred to as a transparent OLED.

Since OLEDs contain materials sensitive to corrosion, for example, due to moisture and/or oxygen, they need to be protected by an encapsulation.

From DE 11 2009 002 034 and U.S. Pat. No. 6,692,610, for example, OLEDs are known which comprise an encapsulation consisting of a glass cover, which has a cavity in which a drying agent is arranged and which can be fastened by an adhesive bead.

Furthermore, for example, from WO 2009/095006 a thin-film encapsulation which comprises a combination of layers applied by plasma-enhanced chemical vapor deposition (PECVD) and atomic layer deposition (ALD) is known.

For thin-film encapsulations, starting materials (precursors) containing halogen, which are known for a short process time, for example, $BBr_3$, $SiCl_4$, $TiCl_4$ and $TaCl_5$, are often used for production. However, due to their breakdown products, for instance HBr in the case of $BBr_3$ and HCl in the case of $SiCl_4$, $TiCl_4$ and $TaCl_5$, starting materials containing halogen may, for example, entail damage to the cathode so that the encapsulation effect of the thin-film encapsulation may even be completely lost. As protection against such damage to the cathode by starting materials containing halogen, an $Al_2O_3$ layer is conventionally used as an interlayer on the cathode. This layer, however, has only a moderately high refractive index of about 1.6 so that optimal light output or transparency cannot be achieved in the case of OLEDs configured as top emitters, or to be transparent.

It could therefore be helpful to provide an organic light-emitting component having a thin-film encapsulation arrangement. It could also be helpful to provide a method of producing an organic light-emitting component.

SUMMARY

We provide an organic light-emitting component including a substrate on which a functional layer stack is applied, the stack including a first electrode, an organic functional layer stack thereover including an organic light-emitting layer and a translucent second electrode thereover, and a translucent halogen-containing thin-film encapsulation arrangement over the translucent second electrode, wherein a translucent protective layer having a refractive index of more than 1.6 is arranged directly on the translucent second electrode between the translucent second electrode and the thin-film encapsulation arrangement.

We also provide a method of producing an organic light-emitting component including providing a substrate on which a functional layer stack is applied, the stack comprising a first electrode, an organic functional layer stack thereover including an organic light-emitting layer and a translucent second electrode thereover, applying a translucent protective layer directly on the translucent second electrode with a halogen-free metal compound, the protective layer having a refractive index of more than 1.6, and applying a translucent thin-film encapsulation arrangement on the translucent protective layer with a metal compound containing halogen.

We further provide an organic light-emitting component including a substrate, on which a functional layer stack is applied, the stack comprising a first electrode, an organic functional layer stack thereover including an organic light-emitting layer and a translucent second electrode thereover, and a translucent thin-film encapsulation arrangement over the translucent second electrode, wherein a translucent protective layer having a refractive index of more than 1.6 is arranged directly on the translucent second electrode between the translucent second electrode and the thin-film encapsulation arrangement.

DETAILED DESCRIPTION

Figure 1:
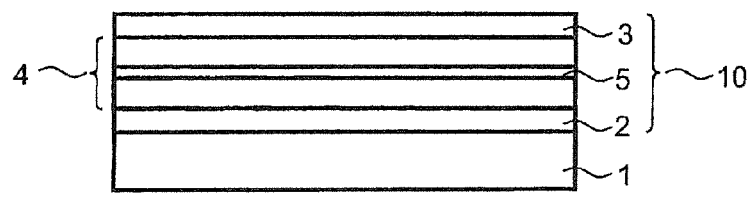
FIGS. 1 to 3 show schematic representations of method steps for production of an organic light-emitting component according to several examples.

Our organic light-emitting component may comprise a substrate on which a functional layer stack having a first electrode and a translucent second electrode thereover is arranged. Between the first and second electrodes, i.e., over the first electrode and under the translucent second electrode, the functional layer stack comprises an organic functional layer stack comprising at least one organic light-emitting layer. The term "organic functional layer stack" means all the organic layers of the organic light-emitting component arranged between the electrodes, while the "functional layer stack" at least also comprises the electrodes in addition to the organic functional layer stack. The organic light-emitting component may in particular be formed as an organic light-emitting diode (OLED) comprising an electroluminescent layer as the organic light-emitting layer.

A "translucent" layer refers to a layer which is transmissive for visible light. The translucent layer may be transparent, i.e., clearly translucent, or at least partially light-scattering and/or partially light-absorbent so that the translucent layer may, for example, also be diffusely or milkily translucent. Particularly preferably, a layer referred to here as translucent is formed to be as transparent as possible so that in particular the absorption of light is as low as possible.

Furthermore, a translucent thin-film encapsulation arrangement is arranged over the translucent second electrode. A translucent protective layer is arranged directly on the translucent second electrode between the translucent second electrode and the translucent thin-film encapsulation arrangement.

In a method of producing an organic light-emitting component, a substrate may be provided having a functional layer stack which comprises a first electrode and a translucent second electrode thereover, between which an organic functional layer stack comprising at least one organic light-emitting layer is arranged. Furthermore, a translucent protective layer is applied directly on the translucent second electrode. In a further method step, a translucent thin-film encapsulation arrangement is arranged on the translucent protective layer.

The examples and features described below apply equally for the organic light-emitting component and for the method of producing the organic light-emitting component.

The translucent protective layer may have a refractive index which is more than 1.6. The refractive index data refer to the refractive index at a wavelength of about 600 nm.

The translucent protective layer may be applied by using a halogen-free metal compound.

The use of a halogen-free metal compound to produce the translucent protective layer directly on the translucent second electrode may, in particular, mean that no starting products containing halogen, in particular no metal compounds containing halogen, are used to produce the translucent protective layer. When the translucent protective layer is applied, it is therefore possible to avoid formation of halogen-hydrogen compounds, for example, HBr or HCl in the case of the halogen-containing starting materials $BBr_3$, $SiCl_4$, $TiCl_4$ and $TaCl_5$ which, for example, could damage the translucent second electrode.

If the organic light-emitting component is formed as a two-side emitting translucent component, then the layers applied on the translucent second electrode, i.e., the protective layer and the thin-film encapsulation arrangement, simultaneously have the task of optical matching in respect of maximum transparency and optimization of the emission ratio between the substrate-side emission and the encapsulation-side emission. In this case, the translucent protective layer may advantageously be provided directly on the translucent second electrode as a high-index antireflection layer on which the thin-film encapsulation arrangement is then applied. A better angle-dependent color homogeneity, or advantages in the light output, compared to known OLEDs may, for example, also be achieved in an organic light-emitting component configured as a top emitter by the translucent protective layer with the refractive index of more than 1.6, due to the better antireflection properties. In both cases, the advantageous optical properties are coupled with a good encapsulation effect due to the thin-film encapsulation arrangement applied on the protective layer.

It may also be particularly advantageous for the translucent protective layer to have a refractive index of more than 1.8, and preferably more than 2.0.

Since, in the organic light-emitting component described here, a protective layer having a refractive index of more than 1.6 is applied instead of a known $Al_2O_3$ interlayer, the transparency loss in the visible wavelength range due to the $Al_2O_3$ layer, and an inferior output efficiency of light due to the refractive index of $Al_2O_3$ being too low, can be avoided by the protective layer described here.

Furthermore, it is however possible for the thin-film encapsulation arrangement, i.e., the encapsulation layers of the thin-film encapsulation arrangement, applied on the translucent protective layer, for example, also to be applied by using a metal compound containing halogen, which allows efficient industrial manufacture. By virtue of the translucent protective layer applied halogen-free, the advantage of the rapid deposition of the thin-film encapsulation arrangement using starting materials containing halogen can therefore still be used.

A thin-film encapsulation arrangement means a device suitable to form a barrier against atmospheric substances, in particular against moisture, oxygen and/or against further harmful substances, for instance corrosive gases, for example, hydrogen sulfide. The thin-film encapsulation arrangement may to this end comprise one or more encapsulation layers, each with a thickness less than or equal to a few 100 nm. Suitable materials for the layers of the thin-film encapsulation arrangement are, for example, aluminum oxide, zinc oxide, zirconium oxide, titanium oxide, hafnium oxide, tantalum oxide. Preferably, the encapsulation arrangement comprises a layer sequence having a multiplicity of the thin layers, each of which may have a thickness of one atomic layer to 10 nm, the limits of the range indicated being included. The encapsulation arrangement may, for example, comprise at least two layers of different materials. In particular, the encapsulation arrangement may also comprise at least three or more layers of different materials. Furthermore, the encapsulation arrangement may comprise a plurality of layer stacks above one another, each having at least two, three or more layers of different materials so that the encapsulation arrangement may comprise the layers of the different materials alternately above one another.

In particular, the translucent protective layer may also be formed as an encapsulation layer and therefore form a first translucent encapsulation layer over the functional layer stack directly on the translucent second electrode, which together with the translucent thin-film encapsulation arrangement forms an encapsulation.

Furthermore, the translucent protective layer may also comprise more than one layer. For example, the translucent protective layer may be formed by a layer stack having at least two layers, each of which is applied by a halogen-free metal compound. In a layer stack in which the thickness of one or all layers of the protective layer is less than the wavelength of the light emitted by the organic light-emitting component, the protective layer refractive index described here may be a refractive index averaged over the layers.

The translucent protective layer may be applied by an atomic layer deposition (ALD) method. Furthermore, the thin-film encapsulation arrangement may also be applied by ALD.

ALD refers in particular to a method in which a first gaseous starting compound is supplied to a volume in which a surface to be coated is provided so that the first gaseous compound can adsorb on the surface. After preferably complete or almost complete coverage of the surface with the first starting compound, that part of the first starting compound which is still gaseous and/or not adsorbed on the surface is generally removed from the volume and a second starting compound is supplied. The second starting compound is provided to react chemically with the first starting compound adsorbed on the surface to form a solid ALD layer.

It should be pointed out that more than two starting compounds may also be used for the atomic layer deposition.

During the atomic layer deposition, it is generally advantageous that the surface to be coated is heated to a temperature above room temperature. In this way, the reaction to form the solid ALD layer can be thermally initiated. The temperature of the surface to be coated in this case generally depends on the starting compounds. Furthermore, the ALD method may be carried out with generation of a plasma (PEALD: "plasma-enhanced atomic layer deposition") or in the absence of a plasma (PLALD: "plasma-less atomic layer deposition"). In respect of the conduct of the ALD method and the materials and parameters used therefor, reference is made to US 2011/

0121354 A1, US 2011/0114992 A1 and US 2011/0049730 A1, the subject matter of which is hereby explicitly incorporated by reference.

The translucent protective layer may be applied, in particular by ALD, at a temperature less than or equal to 150° C., preferably less than or equal to 120° C., and particularly preferably less than or equal to 90° C. The translucent thin-film encapsulation arrangement may likewise be applied at such a temperature. In this way, damage to or detrimental influencing of the layers of the functional layer stack at higher temperatures can be avoided.

As an alternative or in addition to thin layers produced by ALD, the thin-film encapsulation arrangement may comprise at least one or a multiplicity of further layers, i.e., in particular barrier layers and/or passivation layers, deposited by thermal evaporation or by a plasma-enhanced process, for instance sputtering or PECVD. Suitable materials therefor may be the aforementioned materials and silicon nitride, silicon oxide, silicon oxynitride, indium tin oxide, indium zinc oxide, aluminum-doped zinc oxide, aluminum oxide as well as mixtures and alloys of those materials. The one or more further encapsulation layers may, for example, each have a thickness of 1 nm to 5 µm, and preferably 1 nm to 400 nm, the limits of the ranges indicated being included.

The translucent protective layer may comprise an oxide, in particular a metal oxide, having the aforementioned refractive index, in particular one or more of the following materials: zirconium dioxide ($ZrO_2$), titanium dioxide ($TiO_2$), zinc oxide (ZnO), hafnium dioxide ($HfO_2$), tin dioxide ($SnO_2$), tantalum oxide ($Ta_2O_5$), vanadium oxide ($V_2O_5$). Accordingly, a halogen-free metal compound which contains Zr, Ti, Zn, Hf, Sn, Ta or V may advantageously be used to produce the translucent protective layer for the method of producing the organic light-emitting component.

The halogen-free metal compound may comprise a halogen-free metalorganic compound. The halogen-free metalorganic compound may, for example, comprise tetrakis(dimethylamine) (TDMA) or an alcoholate, and may in particular be a halogen-free metalorganic compound based on a TDMA or an alcoholate, in particular having one of the metals Zr, Ti, Zn, Hf, Sn, Ta, V.

When using starting materials containing halogen, for example, compounds containing chlorine, a relative proportion of the halogen, for example, chlorine in the layer produced may be detectable by suitable measurement methods, for example, mass spectroscopy or FIB analysis (FIB: "focused ion beam"). If, conversely, a halogen-free metal compound is used, for instance one of those mentioned above and below, no such relative halogen proportions can correspondingly be detected in the layer produced. In particular, for example, it is therefore also possible to determine whether halogen-containing or halogen-free starting materials were used by comparing a layer produced by starting materials containing halogen and a layer produced by halogen-free starting materials. If no halogen, for example, chlorine is detected in a layer, then it can be deduced therefrom that a corresponding starting compound containing halogen, for example, containing chlorine was not used in the production thereof.

The halogen-free metal compound may in particular be formed by one of the following materials, for which exemplary temperatures are indicated in brackets for ALD methods with the respectively indicated further starting materials to form the materials respectively indicated thereafter:

Hf[N(Me$_2$)]$_4$ ($H_2O$; 90° C.; $HfO_2$)
tetrakis(dimethylamino)tin ($H_2O_2$; 50° C.; $SnO_2$)
$C_{12}H_{26}N_2Sn$ ($H_2O_2$; 50° C.; $SnO_x$)
Ta[N(CH$_3$)$_2$]$_5$ ($O_2$ plasma; 100° C.; $Ta_2O_5$)
Ti[OCH(CH$_3$)]$_4$ ($H_2O$; 35° C.; $TiO_2$)
VO(OC$_3$H$_9$)$_3$ ($O_2$; 90° C.; $V_2O_5$)
Zn(CH$_2$CH$_3$)$_2$ ($H_2O$; 60° C.; ZnO)
Zn(CH$_2$CH$_3$)$_2$ ($H_2O_2$; room temperature; ZnO)
tetrakis(dimethylamino)zirconium ($H_2O$; 80° C.; $ZrO_2$).

For application of the translucent thin-film encapsulation arrangement having one or more translucent encapsulation layers on the translucent protective layer, one of the aforementioned materials may be used. Furthermore, one of the following materials may be used, for which, as above, exemplary temperatures are indicated in brackets for ALD methods with the respectively indicated further starting materials to form the materials respectively indicated thereafter:

trimethylaluminum ($H_2O$; 33° C., 42° C.; $Al_2O_3$)
trimethylaluminum ($O_3$; room temperature; $Al_2O_3$)
trimethylaluminum ($O_2$ plasma; room temperature; $Al_2O_3$)
BBr$_3$ ($H_2O$; room temperature; $B_2O_3$)
Cd(CH$_3$)$_2$ ($H_2S$; room temperature; CdS)
Pd(hfac)$_2$ ($H_2$, 80° C.; Pd)
Pd(hfac)$_2$ ($H_2$ plasma, 80° C.; Pd)
MeCpPtMe$_3$ ($O_2$ plasma+$H_2$; 100° C.; Pt)
MeCpPtMe$_3$ ($O_2$ plasma; 100° C.; $PtO_2$)
Si(NCO)$_4$ ($H_2O$; room temperature; $SiO_2$)
SiCl$_4$ ($H_2O$; room temperature, with pyridine catalyst; $SiO_2$)
TaCl$_5$ ($H_2O$; 80° C.; $Ta_2O_5$)
TaCl$_5$ (H plasma; room temperature; Ta)
TiCl$_4$ (H plasma; room temperature; Ti)
TiCl$_4$ ($H_2O$; 100° C.; $TiO_2$).

A translucent second electrode may comprise a transparent conductive oxide or consists of a transparent conductive oxide. Transparent conductive oxides (TCOs) are transparent conductive materials, generally metal oxides, for example, zinc oxide, tin oxide, cadmium oxide, titanium oxide, indium oxide or indium tin oxide (ITO). Besides binary metal-oxygen compounds, for example, ZnO, $SnO_2$ or $In_2O_3$, ternary metal-oxygen compounds, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also fall within the TCO group. Furthermore, the TCOs do not necessarily correspond to a stoichiometric composition, and they may also be p- or n-doped.

Furthermore, the translucent second electrode may comprise a metal layer or a metal film having a metal or an alloy, for example, having one or more of the following materials: Al, Cu, Ag, Au, Pt, Pd, Mg, Ca, Sr, Ba, Ge, Sn, Li, Sm, Y, Yb, Ti, Zr, Zn. The metal layer or the metal film has such a small thickness that the metal layer or the metal film is at least partially transmissive for light.

The translucent second electrode may also comprise a combination of at least one or more TCO layers and at least one translucent metal layer.

The materials for the translucent second electrode may be partially alone, in alloys or in combinations, for example, sensitively in relation to starting materials containing halogen in deposition of a layer directly on the translucent second electrode since, during the deposition itself and/or conversion into the final oxide by starting materials containing halogen, damage or modification of the second electrode and possibly also of further layers of the organic light-emitting component may be caused, which influence the function of the component and/or by which the encapsulation effect may be destroyed. As already described above, such damage can be avoided by deposition of the translucent protective layer described here directly on the translucent second electrode by using a halogen-free metal compound.

The substrate may comprise one or more materials in the form of a layer, a plate, a sheet or a laminate, which are selected from glass, quartz, plastic, metal, silicon wafer. The substrate particularly preferably comprises or is glass, for example, in the form of a glass layer, glass sheet or glass plate.

The substrate and the first electrode may be formed to be translucent so that light generated in the light-emitting layer can be emitted through the translucent first electrode and the translucent substrate. In this case, the organic light-emitting component may be formed as a bottom emitter and as a top emitter or as a transparent OLED.

If the first electrode is formed to be translucent, then the first electrode may comprise one of the materials mentioned in connection with the translucent second electrode, in particular a TCO. If the first electrode is formed to be reflective, it may, for example, comprise one or more of the aforementioned metals with a sufficiently large thickness. As an alternative or in addition, the first electrode formed to be reflective may also comprise one or more of the aforementioned TCO materials.

The organic functional layer stack may comprise layers having organic polymers, organic oligomers, organic monomers, small nonpolymeric organic molecules ("small molecules") or combinations thereof. In particular, it may be advantageous for the organic functional layer stack to comprise an organic functional layer configured as a hole transport layer to allow effective hole injection into the at least one light-emitting layer. For example, tertiary amines, carbazole derivatives, conductive polyaniline or polyethylene dioxythiophene may prove advantageous as materials for a hole transport layer. Materials which exhibit radiation emission because of fluorescence or phosphorescence, for example, polyfluorene, polythiophene or polyphenylene, or derivatives, compounds, mixtures or copolymers thereof, are suitable as materials for the at least one organic light-emitting layer. Furthermore, the organic functional layer stack may comprise a functional layer formed as an electron transport layer. Furthermore, the layer stack may also comprise electron and/or hole blocking layers. The organic functional layer stack may also comprise a multiplicity of organic light-emitting layers arranged between the electrodes.

In respect of the basic structure of an organic light-emitting component and, for example, in respect of the structure, layer composition and materials of the organic functional layer stack, reference is made to WO 2010/066245 A1, which particularly in relation to the structure, layer composition and the materials of an organic light-emitting component is hereby explicitly incorporated by reference.

The electrodes may respectively be formed over a large area. In this way, large-area emission of the light generated in the organic light-emitting layer can be made possible. In this case, "large area" may in particular mean that the organic light-emitting component, and in particular the organic light-emitting layer, has an area, particularly preferably a continuous area, greater than or equal to a few square millimeters, preferably greater than or equal to one square centimeter, and particularly preferably greater than or equal to one square decimeter.

Other advantages and refinements may be found in the following examples described in connection with the figures.

In the examples and figures, elements which are the same or of the same type, or which have the same effect, may respectively be provided with the same references. The elements represented and their size proportions with respect to one another are not to be regarded as true to scale. Rather, individual elements, for example, layers, parts, components and regions, may be represented exaggeratedly large for better representation and/or for better comprehension.

FIG. 1 shows an example of a first method step of a method of producing an organic light-emitting component 100, in which a substrate 1, on which a functional layer stack 10 is applied, is provided.

The functional layer stack 10 comprises a first electrode 2 and a second electrode 3 thereover, between which an organic functional layer stack 4 is arranged. The organic functional layer stack 4 comprises at least one organic light-emitting layer 5.

The organic functional layer stack 4 having the at least one organic light-emitting layer 5 furthermore comprises, for example, a hole injection layer, a hole transport layer, an electron blocking layer, a hole blocking layer, an electron transport layer and/or an electron injection layer suitable for conducting holes and electrons to the organic light-emitting layer 5 or blocking the respective transport. Furthermore, it is also possible for the organic functional layer stack 4 to comprise a plurality of light-emitting layers. Suitable layer structures for the organic functional layer stack 4 are known and will therefore not be further mentioned here.

The second electrode 3, arranged lying opposite the substrate 1, is formed to be translucent and comprises, for example, one or more translucent metal layers, each having one or more of the following metals: Al, Cu, Ag, Au, Pt, Pd, Mg, Ca, Sr, Ba, Ge, Sn, Li, Sm, Y, Yb, Ti, Zr, Zn. Furthermore, as an alternative or in addition, the translucent second electrode 3 may comprise one or more TCOs as described above in the general part, for example, ITO. The translucent second electrode 3 may also be formed as a multilayer electrode having at least one or more TCO layers and at least one or more translucent metal layers.

In the example shown, the first electrode 2 is formed as an anode and the second electrode 3 is formed as a cathode. As an alternative to this, the polarities of the electrodes 2, 3 may also be configured the other way round.

The layer stack formed by the substrate 1 with the functional layer stack 10 is configured as a two-side emitting transparent OLED. To this end, in addition to the second electrode 3, the substrate 1 is also formed to be translucent, for example, in the form of a glass plate or glass layer, and the first electrode 2 is also formed to be translucent. The first electrode 2 comprises, for example, a transparent conductive oxide such as, for instance, ITO or another material mentioned above in the general part for a transparent electrode.

Alternatively, it is also possible that the layer stack formed by the substrate 1 and the functional layer stack 10 form an OLED configured as a top emitter. To this end, the first electrode 2 may preferably be formed to be reflective, or a reflective layer, which reflects the light generated in the organic light-emitting layer 5 during operation, and emitted in the direction of the substrate 1, in the direction of the translucent second electrode 3, may additionally be provided on the substrate 1.

Since the materials for the electrodes 2, 3, in particular the aforementioned metals as well as materials of the organic functional layer stack 4, may be sensitive to moisture, oxygen and other corrosive gases, for example, hydrogen sulfide, it is necessary to encapsulate the functional layer stack 10. To this end, as described in the method steps below, a thin-film encapsulation arrangement 7 is applied over the functional layer stack 10. Since the layer stack is configured as a transparent OLED, or at least as a top emitter, besides the protective function for the functional layer stack 10, the encapsulation must simultaneously fulfil the function of optical matching with a view to maximum transparency and optimization of the light emission.

To attain the greatest possible leaktightness, the layers applied on the functional layer stack 10, which are described below, are applied by an atomic layer deposition method (ALD method). We found that, in particular, the metals mentioned above for the translucent second electrode 3, as well as compounds, combinations or alloys thereof, are sensitive to starting materials containing halogen, which are conventionally used in ALD methods of producing encapsulation layers. To ensure reliable operation of the organic light-emitting component 100, however, it is necessary that the starting materials for ALD layer production do not damage the layers of the functional layer stack 10, and especially the translucent second electrode 3, or modify them such that the function of the component is influenced and/or the encapsulation effect is negated, both during the deposition and during their chemical reaction to form the final oxide.

Furthermore, it is necessary for the layers applied over the translucent second electrode 3, in particular the layer applied directly on the translucent second electrode 3, to have a suitable refractive index so that, due to antireflection properties resulting therefrom, for example, a better angle-dependent color homogeneity and/or effective light output can be achieved. In particular, it is advantageous for the layer applied directly on the translucent second electrode 3 to be configured as a high-index antireflection layer.

Figure 2:
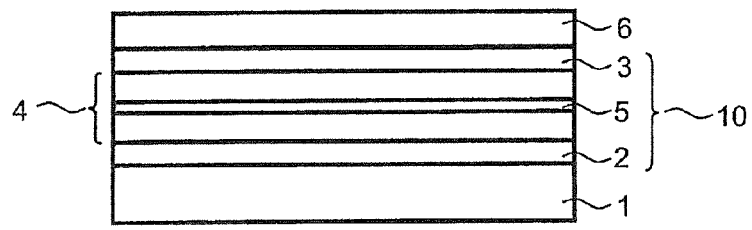

To this end, in a second method step, according to FIG. 2, a translucent protective layer 6 is applied without intermediary and directly on the translucent second electrode 3 by ALD. The translucent protective layer 6 has a refractive index of more than 1.6, preferably more than 1.8, and particularly preferably more than 2.0. In the example shown, the translucent protective layer 6 comprises a metal oxide, preferably $ZrO_2$, $TiO_2$, ZnO, $HfO_2$, $SnO_2$, $Ta_2O_5$ or $V_2O_5$, which is applied by ALD. To not detrimentally influence the layers of the functional layer stack 10 during the ALD method, the ALD method is carried out at a temperature less than or equal to 150° C., preferably less than or equal to 120° C., and particularly preferably less than or equal to 90° C.

As starting materials for the translucent protective layer 6, a halogen-free metal compound is used as a source of the metal of the translucent protective layer 6. To this end, halogen-free metalorganic compounds having one of the metals Zr, Ti, Zn, Hf, Sn, Ta, V are preferably used, in particular those based on TDMA or an alcoholate, for example, one of the materials mentioned above in the general part which allow ALD deposition at low temperatures, i.e., temperatures below 100° C. Thus, for example, $Ti[OCH(CH_3)]_4$ or $Zr(N(CH_3)_2)_4$ are respectively used as a halogen-free metal compound for deposition of $TiO_2$ or $ZrO_2$ as a translucent protective layer 6.

Figure 3:
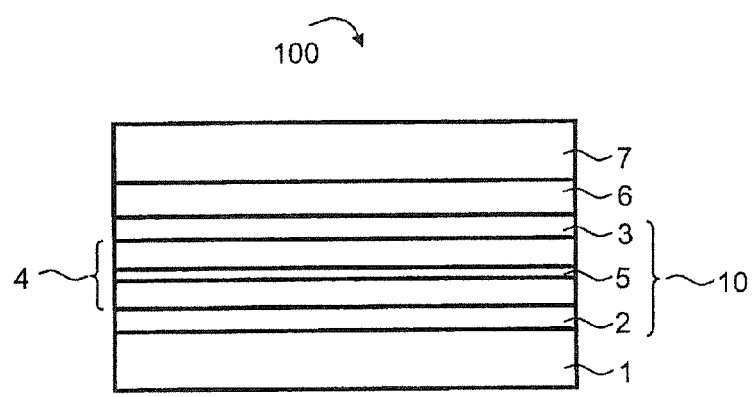

In a further method step, according to FIG. 3, a thin-film encapsulation arrangement 7 is deposited on the translucent protective layer 6, this arrangement preferably likewise being applied by an ALD method at the aforementioned temperatures. Since the layers of the functional layer stack 10 are protected by the translucent protective layer 6 directly on the translucent second electrode 3, the encapsulation layers of the thin-film encapsulation arrangement 7 may be of any desired type, and in particular even applied, for example, by using metal compounds containing halogen.

If, for example, the translucent protective layer 6 is deposited halogen-free by a titanium alcoholate to form $TiO_2$, the thin-film encapsulation arrangement 7 may likewise comprise at least one or more $TiO_2$ encapsulation layers, but which are applied by using $TiCl_4$.

Furthermore, it is also possible, for example, to deposit an aluminum titanium oxide as an encapsulation layer of the thin-film encapsulation arrangement 7, by using trimethylaluminum and $TiCl_4$.

Instead of a translucent protective layer 6 which consists of $TiO_2$, it may also consist, for example, of $ZrO_2$, which is deposited halogen-free by using a zirconium alcoholate or TDMAZr. Furthermore, the aforementioned encapsulation layers of $TiO_2$ and/or aluminum titanium oxide may be applied as the thin-film encapsulation arrangement 7 by using metal compounds containing halogen.

Furthermore, it is also possible that, for example, $HfO_2$ is applied as a translucent protective layer 6, over which one of the aforementioned thin-film encapsulation arrangements 7 is applied.

The thin-film encapsulation arrangement 7 may consist of one encapsulation layer or comprise a multiplicity of the same or different encapsulation layers. As an alternative to the ALD method, at least some of these may also be applied by another method, for example, by PECVD or sputtering.

In particular, the encapsulation arrangement 7 may, for example, comprise at least two layers of different materials. Furthermore, the encapsulation arrangement 7 may also comprise at least three or more layers of different materials. Furthermore, a plurality of layer stacks, each having at least two, three or more layers of different materials, may also be arranged above one another as an encapsulation arrangement 7.

The finished organic light-emitting component 100 shown in FIG. 3 therefore comprises, on the substrate 1, the functional layer stack 10 formed from the first electrode 2, the organic functional layer stack 4 thereover comprising at least one organic light-emitting layer 5, and the translucent second electrode 3 thereover, over which the translucent protective layer 6 is applied directly on the translucent second electrode 3, the thin-film encapsulation arrangement 7 being applied thereover, the translucent protective layer having a refractive index of more than 1.6.

By virtue of the method described above, it is possible to obtain an OLED as a top emitter, a two-side emitting OLED or a transparent OLED, which has a high efficiency in respect of light output, or a high transparency, coupled with a good encapsulation effect. By introduction of the protective layer 6 applied halogen-free, the advantage of rapid ALD deposition with starting materials containing halogen can still be used without damage to the layers of the functional layer stack 10 occurring. In particular, the translucent protective layer 6 may also be formed as an encapsulation layer which, together with the thin-film encapsulation arrangement 7 arranged thereover, is used for encapsulation of the functional layer stack 10.

As an alternative or in addition, the examples described in connection with the figures may comprise further features according to the examples described above in the general part.

By the description with the aid of examples, our elements and methods are not restricted to the examples. Rather, this disclosure covers any new feature and any combination of features, which includes in particular any combination of features in the appended claims, even if the feature or combination is not explicitly indicated per se in the claims or the examples.

The invention claimed is:

1. A method of producing an organic light-emitting component comprising:
   providing a substrate on which a functional layer stack is applied, the stack comprising a first electrode, an organic functional layer stack thereover comprising an organic light-emitting layer and a translucent second electrode thereover, applying a translucent protective layer directly on the translucent second electrode with a halogen-free metalorganic compound, the protective layer having a refractive index of more than 1.6; and applying a translucent thin-film encapsulation arrangement on the translucent protective layer with a metal compound containing halogen.

2. The method according to claim 1, wherein the protective layer has a refractive index of more than 1.8.

3. The method according to claim 1, wherein the protective layer and the thin-film encapsulation arrangement are respectively applied by an atomic layer deposition method.

4. The method according to claim 1, wherein the protective layer is applied at a temperature less than or equal to 150° C.

5. The method according to claim 4, wherein the protective layer is applied at a temperature less than or equal to 120° C.

6. The method according to claim 1, wherein the halogen-free metalorganic compound comprises a tetrakis(dimethylamine) or an alcoholate.

7. The method according to claim 1, wherein the halogen-free metalorganic compound contains Zr, Ti, Zn, Hf, Sn, Ta or V.

8. The method according to claim 1, wherein the translucent second electrode comprises at least one selected from the group consisting of a transparent conductive oxide, Al, Cu, Ag, Au, Pt, Pd, Mg, Ca, Sr, Ba, Ge, Sn, Li, Sm, Y, Yb, Ti, Zr and Zn.

9. The method according to claim 1, wherein the protective layer has a refractive index of more than 2.0.

10. The method according to claim 5, wherein the temperature is less than or equal to 90° C.

11. The method of claim 1, wherein the protective layer comprises at least one material selected from the group consisting of zirconium dioxide, titanium dioxide, zinc oxide, hafnium oxide, tin oxide, tantalum oxide and vanadium oxide.

12. The method of claim 1, wherein the protective layer is halogen free.

13. The method of claim 1, wherein the substrate and the first electrode are translucent.

14. The method of claim 1, wherein the protective layer has a refractive index of more than 2.0.

15. A method of producing an organic light-emitting component comprising:

providing a substrate on which a functional layer stack is applied, the stack comprising a first electrode, an organic functional layer stack thereover comprising an organic light-emitting layer and a translucent second electrode thereover;

applying at a temperature less than or equal to 150° C. a translucent protective layer directly on the translucent second electrode with a halogen-free metal compound, the protective layer having a refractive index of more than 1.6; and applying a translucent thin-film encapsulation arrangement on the translucent protective layer with a metal compound containing halogen.

\* \* \* \* \*